United States Patent
Isohata et al.

(10) Patent No.: US 9,252,783 B2
(45) Date of Patent: Feb. 2, 2016

(54) OSCILLATOR, ELECTRONIC DEVICE AND MOVING OBJECT

(71) Applicant: SEIKO EPSON CORPORATION, Tokyo (JP)

(72) Inventors: Kensaku Isohata, Minowa-machi (JP); Atsushi Kiyohara, Chino (JP)

(73) Assignee: SEIKO EPSON CORPORATION, Tokyo (JP)

( * ) Notice: Subject to any disclaimer, the term of this patent is extended or adjusted under 35 U.S.C. 154(b) by 0 days.

(21) Appl. No.: 14/220,845

(22) Filed: Mar. 20, 2014

(65) Prior Publication Data

US 2014/0292423 A1    Oct. 2, 2014

(30) Foreign Application Priority Data

Mar. 29, 2013  (JP) ................. 2013-071823

(51) Int. Cl.
*H03L 1/04*     (2006.01)
*H03L 1/02*     (2006.01)

(52) U.S. Cl.
CPC . *H03L 1/04* (2013.01); *H03L 1/025* (2013.01)

(58) Field of Classification Search
CPC ................... H03L 1/04; H03L 1/025
USPC ............................... 331/69, 70
See application file for complete search history.

(56) References Cited

U.S. PATENT DOCUMENTS

| | | | |
|---|---|---|---|
| 7,595,701 B2 * | 9/2009 | Fukuda | 331/158 |
| 2009/0091373 A1 | 4/2009 | Kiyohara | |
| 2011/0234328 A1 * | 9/2011 | Matsuoka et al. | 331/155 |
| 2012/0306582 A1 * | 12/2012 | Ito et al. | 331/69 |

FOREIGN PATENT DOCUMENTS

| | | |
|---|---|---|
| JP | H10-303645 A | 11/1998 |
| JP | A-2003-273646 | 9/2003 |
| JP | A-2009-92449 | 4/2009 |
| JP | A-2010-183228 | 8/2010 |

* cited by examiner

*Primary Examiner* — Joseph Chang
(74) *Attorney, Agent, or Firm* — Oliff PLC

(57) ABSTRACT

An oscillator includes an oscillation element; an oscillation circuit which causes the oscillation element to oscillate; a heat generation element which heats the oscillation element; a temperature control circuit which controls the heat generation element; and a temperature correction circuit which corrects frequency-temperature characteristics of an output signal of the oscillation circuit.

15 Claims, 14 Drawing Sheets

OSCILLATOR, ELECTRONIC DEVICE AND MOVING OBJECT

BACKGROUND

1. Technical Field

The present invention relates to an oscillator, an electronic device and a moving object.

2. Related Art

A quartz crystal oscillator used for a reference frequency signal source such as a communication device or a measurement device is required to have a stable output frequency with a high accuracy with respect to a temperature change. In general, An Oven Controlled Crystal Oscillator (OCXO) which can obtain extremely high frequency stability, among the quartz crystal oscillators is known (refer to JP-A-2010-183228). The OCXO is configured by a quartz crystal resonator contained in a constant temperature oven which is controlled at a constant temperature, and in order to realize the extremely high frequency stability, it is important to make temperature control deviation of the constant temperature oven as small as possible with respect to an ambient temperature change.

FIG. 16A is a view illustrating an example of frequency-temperature characteristics in a case where a temperature control of the constant temperature oven is not performed in the OCXO using an SC-cut quartz crystal resonator, and FIGS. 16B and 16C are views where a portion surrounded by a dashed line is enlarged. By maintaining the temperature inside the constant temperature oven at approximately 80° C., the OCXO can output a stable frequency with a small deviation although the ambient temperature changes. The accuracy of the constant temperature oven is different depending on products, but for example, in a case where the ambient temperature changes from −40° C. to 80° C., and the constant temperature oven changes by ±2° C. from 80° C., the frequency deviation is approximately 20 ppb (hatched portion in FIG. 16B). On the other hand, in a case where the temperature inside the constant temperature oven is set to 80° C., but the temperature inside the constant temperature oven is actually 82° C. shifted by 2° C. to the high temperature side, and the constant temperature oven changes by ±2° C. from 82° C., a frequency of the OCXO has secondary temperature characteristics, and the frequency deviation thereof becomes 40 ppb (hatched portion in FIG. 16C).

In addition, an oscillation circuit and a frequency adjustment circuit also have the temperature characteristics, and it is common that the temperature characteristics are given in such a manner that the frequency of the OCXO decreases linearly with respect to an increase in temperature. Thus, by the setting temperature shifting of the constant temperature oven or the temperature characteristics of a circuit, the frequency-temperature characteristics of the OCXO which should be originally flat have a primary component or a secondary component. For this reason, in the OCXO of the related art, there is a problem that it is difficult to satisfy requirements of the extremely high frequency stability.

SUMMARY

An advantage of some aspects of the invention is to provide an oscillator which can realize frequency stability higher than the Oven Controlled Crystal Oscillator (OCXO) of the related art, and an electronic device and a moving object which use the oscillator.

The invention can be implemented as the following forms or application examples.

Application Example 1

This application example is directed to an oscillator including: an oscillation element; an oscillation circuit which causes the oscillation element to oscillate; a heat generation element which heats the oscillation element; a temperature control circuit which controls the heat generation element; and a temperature correction circuit which corrects frequency-temperature characteristics of an output signal of the oscillation circuit.

According to the oscillator of this application example, in the same manner as the Oven Controlled Crystal Oscillator (OCXO) of the related art, although the internal temperature of the oscillator is controlled so as to be constantly maintained, and further, the internal temperature of the oscillator is slightly changed by an ambient temperature change, it is possible to correct a frequency of the output signal of the oscillation circuit. Thus, it is possible to realize the frequency stability higher than the Oven Controlled Crystal Oscillator (OCXO) of the related art.

Application Example 2

In the oscillator according to the application example described above, the temperature correction circuit may include a primary correction circuit which corrects a primary component of the frequency-temperature characteristics of the output signal of the oscillation circuit.

According to the oscillator of this application example, it is possible to correct the primary component of the frequency-temperature characteristics.

Application Example 3 and Application Example 4

In the oscillator according to the application example described above, the temperature correction circuit may include a secondary correction circuit which corrects a secondary component of the frequency-temperature characteristics of the output signal of the oscillation circuit.

According to the oscillators of these application examples, it is possible to correct the secondary component of the frequency-temperature characteristics.

Application Example 5

In the oscillator according to the application example described above, the temperature correction circuit may include a primary correction circuit which corrects a primary component of the frequency-temperature characteristics of the output signal of the oscillation circuit, and a secondary correction circuit which corrects a secondary component of the frequency-temperature characteristics of the output signal of the oscillation circuit, and the temperature correction circuit may independently control an operation of the primary correction circuit and an operation of the secondary correction circuit.

According to the oscillator of this application example, in accordance with the frequency-temperature characteristics, a selection of the primary correction circuit or the secondary correction circuit, and correction content setting of the primary correction circuit, correction content setting of the secondary correction circuit or the like are independently controlled, and thus it is possible to flexibly and efficiently correct the frequency-temperature characteristics.

Application Example 6 and Application Example 7

In the oscillator according to the application example described above, whether to make each of the correction performed by the first correction circuit and the correction performed by the second correction circuit effective or not may be independently set.

According to the oscillators of these application examples, in accordance with the frequency-temperature characteristics, it is also possible to correct only the primary component, to correct only the secondary component, and to correct both the primary component and the secondary component.

Application Example 8, Application Example 9, Application Example 10, Application Example 11, and Application Example 12

In the oscillator according to the application example described above, correction parameters of the secondary correction circuit may be independently set in a plurality of temperature areas, respectively.

According to the oscillators of these application example, whether or not to correct the secondary component of the frequency-temperature characteristics for each temperature area can be selected, and thus it is possible to flexibly and efficiently correct the frequency-temperature characteristics.

Application Example 13, Application Example 14, and Application Example 15

In the oscillator according to the application example described above, the secondary correction circuit may include a differential amplification circuit that has a first transistor to which an output voltage of a temperature sensor is input, a second transistor to which a reference voltage is input, and a constant current source which controls a sum of a current flowing through the first transistor and a current flowing through the second transistor constantly.

Application Example 16

In the oscillator according to the application example described above, the differential amplification circuit may be set in such a manner that the reference voltage input to the second transistor is variable.

According to the oscillator of this application example, by adjusting the reference signal, the temperature area which is a correction target of the secondary component of the frequency-temperature characteristics can be arbitrarily selected. Thus, it is possible to flexibly and efficiently correct the frequency-temperature characteristics.

Application Example 17

In the oscillator according to the application example described above, the differential amplification circuit may set in such a manner that a current of the constant current source is variable.

According to the oscillator of this application example, in accordance with the amount of the secondary component of the frequency-temperature characteristics, the current of the constant current source is adjusted, and thus it is possible to flexibly and efficiently correct the frequency-temperature characteristics.

Application Example 18

In the oscillator according to the application example described above, the secondary correction circuit may include a plurality of differential amplification circuits, and the plurality of differential amplification circuits may respectively have reference voltages which are different from each other and input to the second transistor.

According to the oscillator of this application example, in a plurality of temperature areas, the secondary components of the frequency-temperature characteristics can be corrected respectively. Thus, it is possible to flexibly and efficiently correct the frequency-temperature characteristics.

Application Example 19

This application example is directed to an electronic device including the oscillator described above.

Application Example 20

This application example is directed to a moving object including the oscillator described above.

BRIEF DESCRIPTION OF THE DRAWINGS

The invention will be described with reference to the accompanying drawings, wherein like numbers reference like elements.

DESCRIPTION OF EXEMPLARY EMBODIMENTS

Hereinafter, preferred embodiments according to the invention will be described in detail with reference to the drawings. The embodiments described below are not intended to unduly limit the content of the invention described in the appended claims. In addition, all of the configurations described below are not essential requirements of the invention.

1. Oscillator

Figure 1:
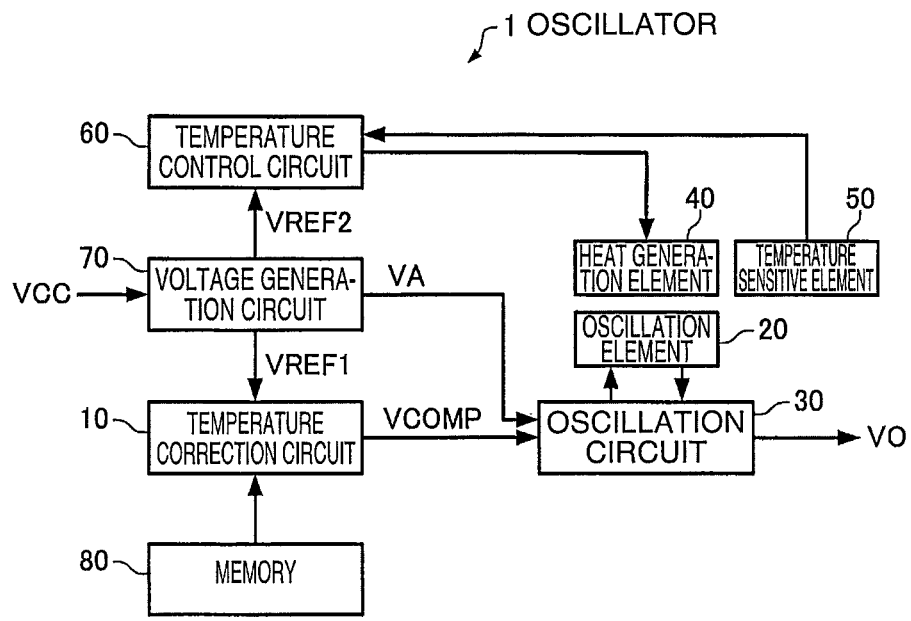
FIG. 1 is an example of a functional block diagram of an oscillator according to the present embodiment.

FIG. 1 is an example of a functional block diagram of an oscillator according to the present embodiment. In addition, FIG. 2 is an example of a sectional view of the oscillator according to the present embodiment.

As illustrated in FIG. 1, an oscillator 1 according to the present embodiment is configured to include a temperature correction circuit 10, an oscillation element 20, an oscillation circuit 30, a heat generation element 40, a temperature sensitive element 50, a temperature control circuit 60, a voltage generation circuit 70, and a memory 80. However, in the oscillator 1 according to the present embodiment, a portion of the configuration elements illustrated in FIG. 1 may be omitted or modified, or other configuration elements may be added thereto.

In the present embodiment, the circuit portion except for the oscillation element 20, the heat generation element 40 and the temperature sensitive element 50 is formed in one chip of IC 5 without some components (external resistor, external capacitor, external coil or the like). However, the circuit portion may be realized by a plurality of IC chips, and the heat generation element 40 and the temperature sensitive element 50 may be formed in one chip of IC 5.

Figure 2:
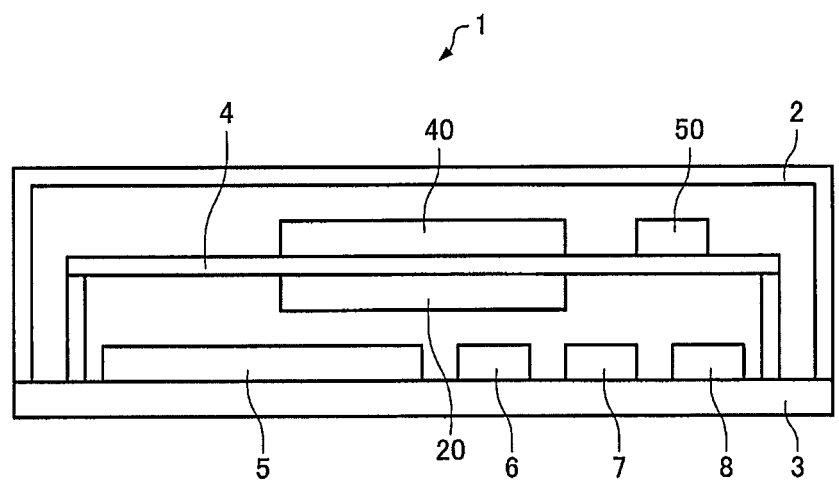
FIG. 2 is an example of a sectional view of the oscillator according to the present embodiment.

As illustrated in FIG. 2, the oscillator 1 includes IC 5 and external components 6, 7 and 8 such as the resistor, capacitor, and the coil which are mounted on an upper surface of a component mounting substrate 3. In addition, a component mounting substrate 4 is provided opposite the component mounting substrate 3, and the heat generation element 40 and the temperature sensitive element 50 are mounted on an upper surface of the component mounting substrate 4. On a lower surface of the component mounting substrate 4, the oscillation element 20 is mounted at an opposite position of the heat generation element 40. Each terminal of the external components 6, 7 and 8, the oscillation element 20, heat generation element 40 and the temperature sensitive element 50 is electrically connected to each desired terminal of the IC 5 by a wire pattern which is not illustrated. Then, a case 2 (or cover) is adhered to the component mounting substrate 3 in such a manner that the component mounting substrate 4, the IC 5, the external components 6, 7 and 8, the oscillation element 20, the heat generation element 40, and the temperature sensitive element 50 are contained therein. A space formed by the case 2 and the component mounting substrate 3 is set as a constant temperature oven, and the oscillator 1 controls the constant temperature oven using the heat generation element 40, in such a manner that the temperature inside the constant temperature oven is constantly maintained.

The voltage generation circuit 70 generates a supply voltage VA of the oscillation circuit 30, a reference voltage VREF1 of the temperature correction circuit 10, and a reference voltage VREF2 of the temperature control circuit 60 from a supply voltage VCC supplied from external portion.

The temperature correction circuit 10 generates a temperature correction voltage VCOMP for correcting frequency-temperature characteristics of an output signal of the oscillation circuit 30. For example, the temperature correction circuit 10 may perform only a primary component correction (hereinafter, referred to as first correction) of the frequency-temperature characteristics of the output signal of the oscillation circuit 30, may perform only a secondary component correction (hereinafter, referred to as second correction), and may perform both the primary component correction and the secondary component correction. In addition, in a case where the temperature correction circuit 10 can perform both the primary component correction and the secondary component correction, the temperature correction circuit 10 may independently set whether to make each of the primary correction and the secondary correction effective or not, and may independently set each of the primary correction parameter and the secondary correction parameter. Further, the temperature correction circuit 10 may perform the secondary corrections independently from each other at a plurality of temperature areas (for example, low temperature side and high temperature side). Meanwhile, a specific circuit configuration example of the temperature correction circuit 10 will be described later.

The oscillation circuit 30 oscillates the oscillation element 20, using a frequency according to the temperature correction voltage VCOMP output from the temperature correction circuit 10.

Figure 3:
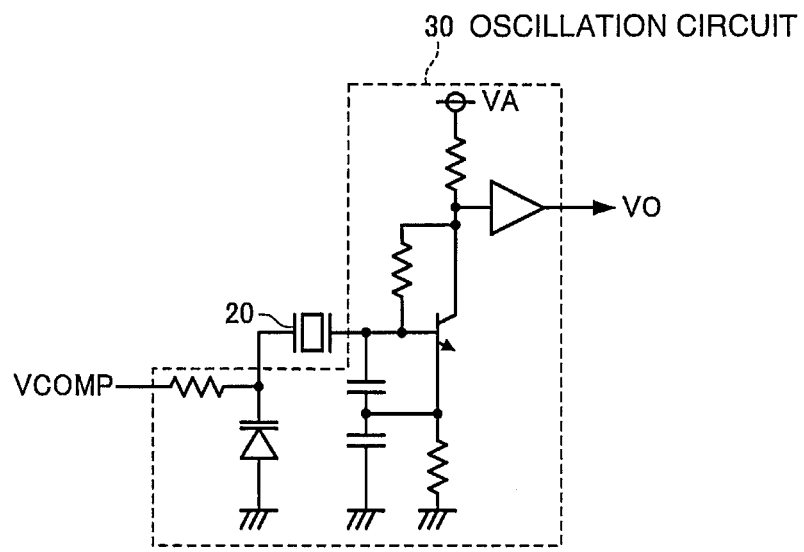
FIG. 3 is a diagram illustrating an example of an oscillation circuit.

In FIG. 3, an example of the oscillation circuit 30 is illustrated. In the oscillation circuit 30 illustrated in FIG. 3, the temperature correction voltage VCOMP is applied to one end of a variable capacitance element (varicap diode), and a capacitance value of the variable capacitance element is changed according to the voltage value, and thereby oscillation frequency is changed. Meanwhile, instead of the variable capacitance element, a capacitance bank is used in which a plurality of capacitance elements (capacitors) each connected in series with different switches, and the plurality of capacitance elements and the different switches are connected in parallel between an end of the oscillation element 20 and a ground, and a capacitance value of the capacitance bank is changed by switching the ON and OFF setting of each switch, and thereby an oscillation frequency may be changed.

It is possible to use, for example, the quartz crystal resonator, a Surface Acoustic Wave (SAW) resonator, or the like of an SC-cut or an AT-cut, as the oscillation element 20. In addition, it is also possible to use, for example, a piezo-electric resonator or Micro Electro Mechanical Systems (MEMS) resonator or the like in addition to the quartz crystal resonator, as the oscillation element 20. It is possible to use piezo-electric material such as a piezo-electric single crystal such as quartz crystal, lithium tantalite or lithium niobate, piezo-electric ceramics of lead zirconate titanate or the like, and silicon semiconductor material, or the like, as substrate material of the oscillation element 20. In addition, as excitation means of the oscillation element 20, drive performed by a piezo-electric effect may be used, or an electrostatic drive performed by coulomb force may be used.

The temperature control circuit 60 controls a heat generation of the heat generation element 40 in such a manner that the temperature is constantly maintained, according to the output voltage of the temperature sensitive element 50 which is arranged near the oscillation element 20.

For example, as the heat generation element 40, an element (power transistor, resistor or the like) which generates heat when current flows may be used. In addition, for example, as the temperature sensitive element 50, a thermistor (Negative Temperature Coefficient (NTC) thermistor or Positive Temperature Coefficient (PTC) thermistor), a platinum resistor, or the like can be used.

For example, the temperature sensitive element 50 with temperature characteristics of a positive slope is arranged near the oscillation element 20, and the temperature control circuit 60 controls in such a manner that when the output voltage of the temperature sensitive element 50 is lower than a reference value, the heat is generated by flowing the current through the heat generation element 40, and when the output voltage of the temperature sensitive element 50 is higher than the reference value, the current does not flow through the heat generation element 40.

Figure 4:
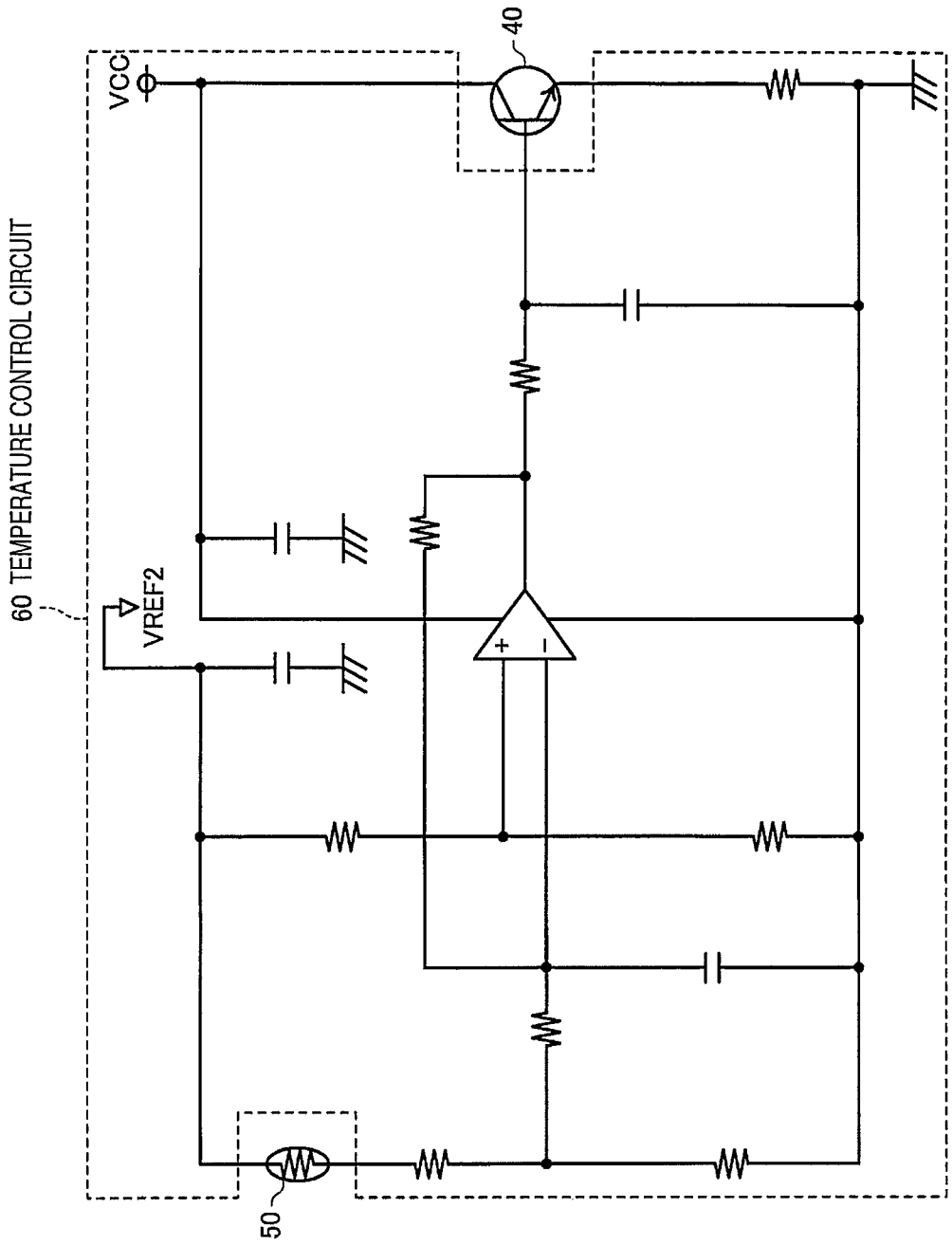
FIG. 4 is a diagram illustrating an example of a temperature control circuit.

In FIG. 4, an example of the temperature control circuit 60 is illustrated. In FIG. 4, an NPN type power transistor is used as the heat generation element 40, and the NTC thermistor is used as the temperature sensitive element 50. In the temperature control circuit 60 illustrated in FIG. 4, when the temperature decreases, a resistance value of the temperature sensitive element 50 (NTC thermistor) increases, and an input potential difference of an operational amplifier becomes large. In contrary, when the temperature increases, the resistance value of the temperature sensitive element 50 (NTC thermistor) decreases, and the input potential difference of the operational amplifier becomes small. An output voltage of the operational amplifier is proportional to the input potential difference. In the heat generation element 40 (NPN type power transistor), when the output voltage of the operational amplifier is higher than a predetermined voltage, the current flows as the voltage value increases thereby increasing an amount of heat generated, and when the output voltage of the operational amplifier is lower than the predetermined voltage value, the current does not flow thereby gradually decreasing the amount of heat generated. Thus, the operation of the heat generation element 40 is controlled in such a manner that the resistance value of the temperature sensitive element 50 (NTC thermistor) becomes a desired value, that is, is maintained at a desired temperature.

The memory 80 is a non-volatile memory, and stores setting information (information regarding whether to perform or not each of the primary correction and the secondary correction, correction parameter of the primary correction, correction parameter of the secondary correction, or the like) of the temperature correction circuit. For example, the memory 80 can be realized by a flash memory such as a Metal-Oxide-Nitride-Oxide-Silicon (MONOS) memory, Electrically Erasable Programmable Read-Only Memory (EEPROM), or the like.

In the oscillator 1, which has such a configuration, according to the present embodiment, based on the frequency-temperature characteristics of the output signal of the oscillation circuit 30 determined according to the temperature characteristics of the oscillation element 20 or the circuit portion, the temperature control circuit 60 controls in such a manner that internal temperature of the constant temperature oven is maintained at the desired temperature (for example, the temperature in which the frequency is maximum if the oscillation element 20 is the SC-cut quartz crystal resonator). Further, a slight frequency deviation occurring by a difference between an actual temperature and the setting temperature inside the constant temperature oven caused by control error of the temperature control circuit 60, is corrected by the temperature correction circuit 10. According to this, it is possible to realize a frequency stability higher than the OCXO of the related art.

Figure 5:
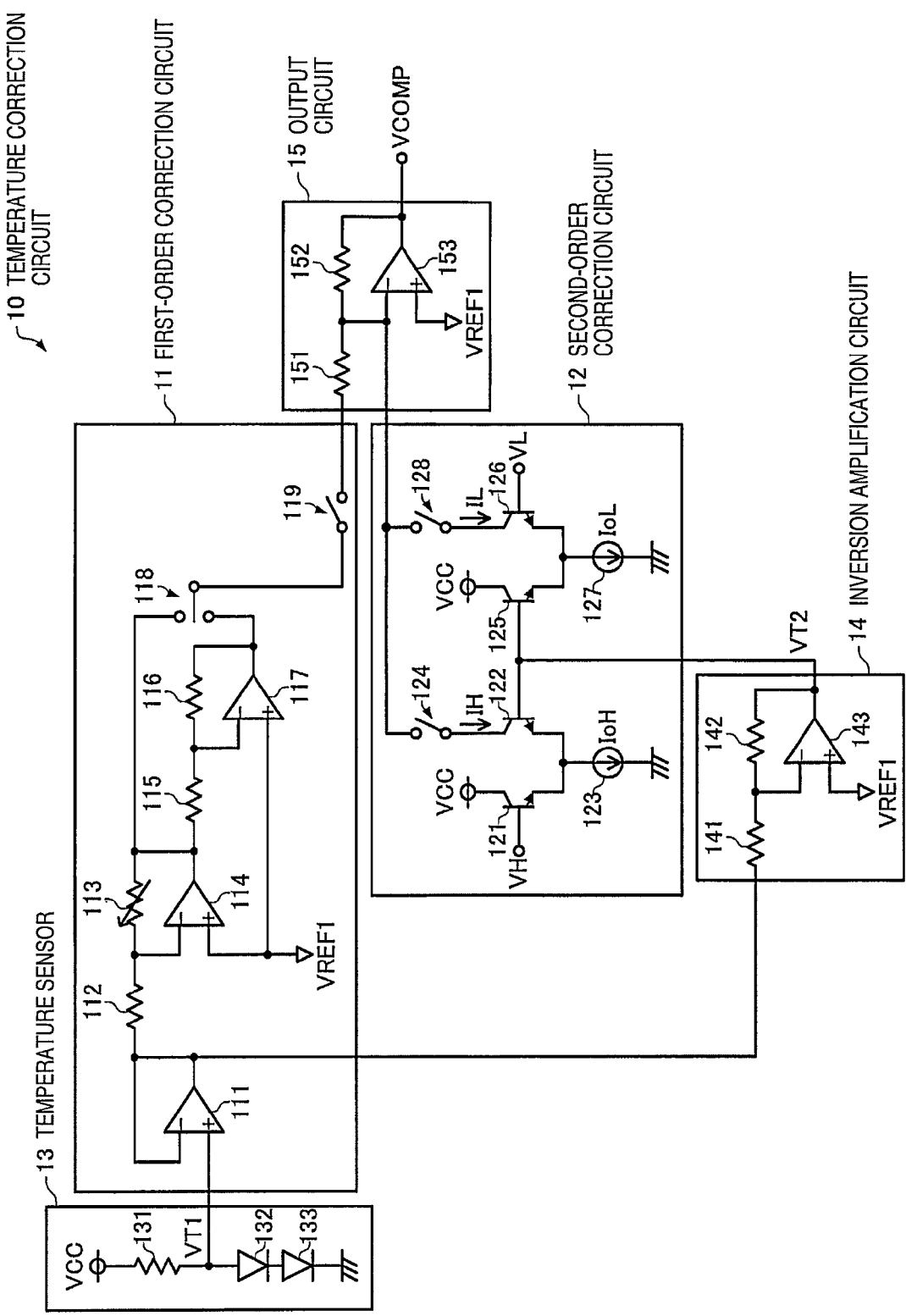
FIG. 5 is a diagram illustrating a configuration example of a temperature correction circuit according to the present embodiment.

Next, a configuration example of the temperature correction circuit which can correct the slight frequency deviation will be described in detail. FIG. 5 is a diagram illustrating the configuration example of the temperature correction circuit according to the present embodiment. As illustrated in FIG. 5, the temperature correction circuit 10 according to the present embodiment is configured to include a primary correction circuit 11, a secondary correction circuit 12, a temperature sensor 13, an inversion amplification circuit 14 and an output circuit 15. However, in the temperature correction circuit 10 according to the present embodiment, a portion of the configuration elements illustrated in FIG. 5 may be omitted or modified, or other configuration elements may be added thereto.

The temperature sensor 13 is configured to include a resistor 131 and diodes 132 and 133. A first terminal of the resistor 131 receives the supply voltage VCC, and a second terminal thereof is connected to an anode terminal of the diode 132. In addition, a cathode terminal of the diode 132 is connected to an anode terminal of the diode 133, and the cathode terminal of the diode 133 is grounded. Then, a signal of a connection point between the second terminal of the resistor 131 and the anode terminal of the diode 132 becomes an output voltage VT1 of the temperature sensor 13. For example, with respect to an increase of the temperature of 1° C., each of the voltages applied to opposite end of each of the diodes 132 and 133 decreases by approximately 2 mV. Thus, the VT1 changes linearly with a negative slope with respect to the change of the internal temperature of the constant temperature oven.

The primary correction circuit 11 is configured to include operational amplifiers 111, 114, and 117, resistors 112, 115 and 116, a variable resistor 113, and switches 118 and 119. The output voltage VT1 of the temperature sensor 13 is input to a non-inverting input terminal (+ input terminal) of the operational amplifier 111, and an inverting input terminal (− input terminal) and an output terminal thereof are connected together to a first terminal of the resistor 112. That is, the operational amplifier 111 buffers the output voltage VT1 of the temperature sensor 13 and then outputs. A second terminal of the resistor 112 is connected to both an inverting input terminal (− input terminal) of the operational amplifier 114 and a first terminal of the variable resistor 113. The reference voltage VREF1 is input to a non-inverting input terminal (+ input terminal) of the operational amplifier 114, an output terminal of the operational amplifier 114 is connected to a second terminal of the variable resistor 113, a first terminal of the resistor 115, and a first input terminal of the switch 118. A second terminal of the resistor 115 is connected to both an inverting input terminal (− input terminal) of the operational amplifier 117 and a first terminal of the resistor 116. The reference voltage VREF1 is input to a non-inverting input terminal (+ input terminal) of the operational amplifier 117, and an output terminal of the operational amplifier 117 is connected to both a second terminal of the resistor 116 and a second input terminal of the switch 118. An output terminal of the switch 118 is connected to a first terminal of the switch 119, and a voltage of a second terminal of the switch 119 becomes the output voltage (primary correction voltage) of the primary correction circuit 11. When the switch 119 is turned on, the primary correction voltage changes linearly with respect to (with respect to a change of the internal temperature of the constant temperature oven) the change of the output voltage VT1 of the temperature sensor 13.

It is possible to change a magnitude of a slope of the primary correction voltage with respect to the VT1, by changing a resistance value of the variable resistor 113. In addition, it is possible to change a polarity (positive or negative) of the slope of the primary correction voltage, by switching the switch 118. Further, by turning off the switch 119, the primary correction voltage always becomes a high impedance regardless of the VT1, and thereby the primary temperature correction can also be ineffective. Information (information of ON and OFF of the switch 119) of setting whether to make the correction performed by the primary correction circuit 11 effective or not, or correction parameter (information of the resistance value of the variable resistor 113, or connection information of the switch 118) of the primary correction circuit 11 is stored in the memory 80.

The inversion amplification circuit 14 is configured to include an operational amplifier 143 and resistors 141 and 142. A first terminal of the resistor 141 is connected to an output terminal of the operational amplifier 111, and a second terminal thereof is connected to both an inverting input terminal (− input terminal) of the operational amplifier 143 and a first terminal of the resistor 142. The reference voltage VREF1 is input to a non-inverting input terminal (+ input terminal) of the operational amplifier 143, and an output terminal of the operational amplifier 143 is connected to a second terminal of the resistor 142. Then, an output voltage of the operational amplifier 143 becomes an output voltage VT2 of the inversion amplification circuit 14. By the inversion amplification circuit 14 with such a configuration, the voltage VT2 is obtained in which the output voltage (that is, VT1) of the operational amplifier 11 is inverted and amplified on the basis of the reference voltage VREF1. Thus, the VT2 changes linearly with a positive slope with respect to the change of the internal temperature of the constant temperature oven.

The secondary correction circuit 12 is configured to include NPN type transistors 121, 122, 125 and 126, constant current sources 123 and 127, and switches 124 and 128. A predetermined reference voltage VH is input to a base terminal of the transistor 121, and the supply voltage VCC is input to a collector terminal of the transistor 121. An emitter terminal of the transistor 121 and an emitter terminal of the transistor 122 are connected together to a first terminal of the constant current source 123, and a second terminal of the constant current source 123 is grounded. The output voltage VT2 of the inversion amplification circuit 14 is input to a base terminal of the transistor 122, and a collector terminal of the transistor 122 is connected to a first terminal of the switch 124. A first differential amplification circuit is configured by the transistors 121 and 122 and the constant current source 123. A constant current IoH flows through the constant current source 123, and when VT2=VH, a current flowing through the emitter and collector of the transistor 122 becomes IH=IoH/2. Then, in a range where the VT2 is higher than the VH, the more the VT2 increases (the higher the internal temperature of the constant temperature oven), the more the IH increases non-linearly, and approaches the IoH. On the other hand, in a range where the VT2 is lower than the VH, the more the VT2 decreases (the lower the internal temperature of the constant temperature oven), the more the IH decreases non-linearly, and approaches zero.

The output voltage VT2 of the inversion amplification circuit 14 is input to a base terminal of the transistor 125, and the supply voltage VCC is input to a collector terminal of the transistor 125. An emitter terminal of the transistor 125 and an emitter terminal of the transistor 126 are connected together to a first terminal of the constant current source 127, and a second terminal of the constant current source 127 is grounded. A constant reference voltage VL different from the reference voltage VH is input to a base terminal of the transistor 126, and a collector terminal of the transistor 126 is connected to a first terminal of the switch 128. A second differential amplification circuit is configured by the transistors 125 and 126, and the constant current source 127. The constant current IoL flows through the constant current source 127, and when VT2=VL, a current flowing through the emitter and collector of the transistor 126 becomes IL=IoL/2. Then, in a range where the VT2 is lower than the VL, the more the VT2 decreases (the lower the internal temperature of the constant temperature oven), the more the IL increases non-linearly, and approaches the IoH. On the other hand, in a range where the VT2 is higher than the VL, the more the VT2 increases (the higher the internal temperature of the constant temperature oven), the more the IL decreases non-linearly, and approaches zero.

A second terminal of the switch 124 is connected to a second terminal of the switch 128, and a voltage of a connection point therebetween becomes the output voltage (secondary correction voltage) of the secondary correction circuit 12. Thus, when both the switches 124 and 128 are turned on, the secondary correction voltage changes non-linearly with respect to the change of the output voltage VT2 of the inversion amplification circuit (with respect to the change of the internal temperature of the constant temperature oven) 14, according to a sum of the IL and the IH. In addition, when only one of the switches 124 and 128 is turned on, the secondary correction voltage changes non-linearly with respect to the change of the output voltage VT2 (with respect to the change of the internal temperature of the constant temperature oven), according to the IL or the IH. Further, by turning off both the switches 124 and 128, the secondary correction voltage always becomes a high impedance regardless of the VT2, and thereby the secondary temperature correction can also be ineffective. Information (information of ON and OFF of the switches 124 and 128) of setting whether to make the correction performed by the secondary correction circuit 12 effective or not is stored in the memory 80.

The output circuit 15 is configured to include an operational amplifier 153 and resistors 151 and 152. A first terminal of the resistor 151 is connected to a second terminal of the switch 119, and a second terminal of the resistor 151 is connected to an inverting input terminal (− input terminal) of the operational amplifier 153, a first terminal of the resistor 152, a second terminal of the switch 124, and a second terminal of the switch 128. The reference voltage VREF1 is input to a non-inverting input terminal (+ input terminal) of the operational amplifier 153, and an output terminal of the operational amplifier 153 is connected to a second terminal of the resistor 152. Then, an output voltage of the operational amplifier 153 becomes the output voltage of the output circuit 15. The output circuit 15 with such a configuration outputs a voltage in which the output voltage (primary correction voltage) of the primary correction circuit 11 is added to the output voltage (secondary correction voltage) of the secondary correction circuit 12, and the voltage becomes the temperature correction voltage VCOMP which is the output voltage of the temperature correction circuit 10.

When ambient temperature increases, the internal temperature of the constant temperature oven also slightly increases, and when the ambient temperature decreases, the internal temperature of the constant temperature oven also slightly decreases. For example, in a case where the internal temperature of the constant temperature oven is set to a temperature (for example, 80° C.) in which the frequency of the oscillator 1 is maximum, if the internal temperature of the constant temperature oven is equal to the set temperature when the ambient temperature is the reference temperature (for example 25° C.), even by a slight (for example, in a range of 78° C. to 82° C.) change of the internal temperature of the constant temperature oven, a frequency deviation of the frequency of the oscillator 1 decreases, in a temperature range (for example, −30° C. to 85° C.) of operation guarantee of the oscillator 1. However, if the internal temperature of the constant temperature oven is not equal to the set temperature when the ambient temperature is the reference temperature (for example 25° C.), in an area (for example, near −30° C. or near 85° C.) near the end of the operation guarantee temperature range, for example −30° C. to 85° C., the frequency deviation increases. Accordingly, in the present embodiment, by the secondary temperature correction, the frequency deviation near the end of the operation guarantee temperature range decreases efficiently.

Figure 6A:
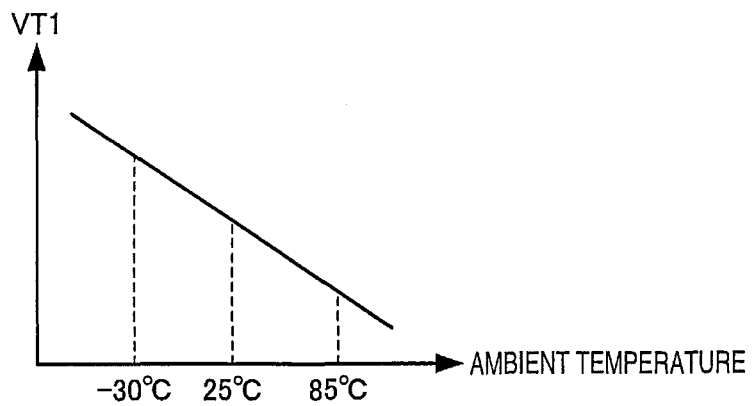
FIGS. 6A to 6D are explanatory diagrams with regard to a second temperature correction according to the present embodiment.
Figure 6B:
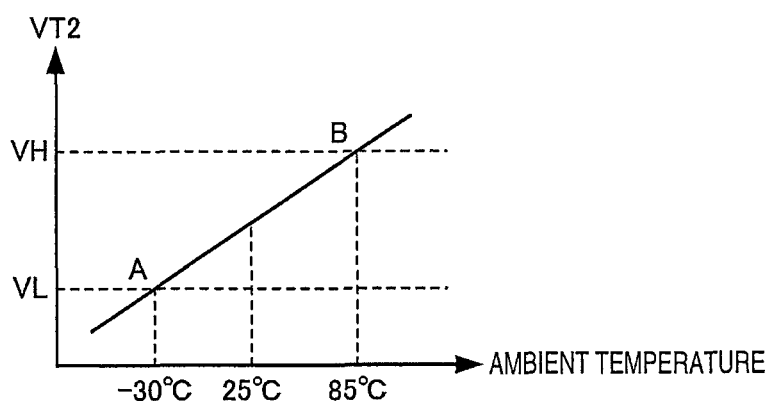
Figure 6C:
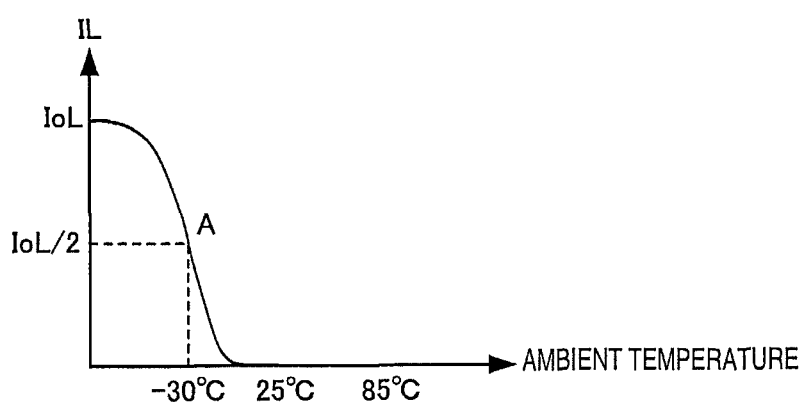
Figure 6D:
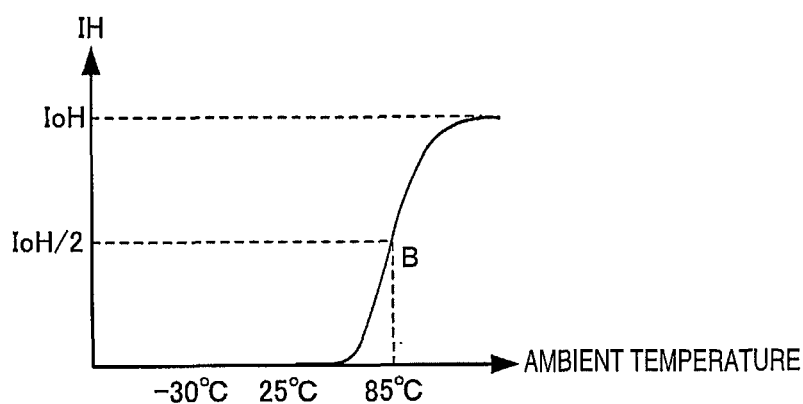

FIGS. 6A to 9B are views illustrated to explain the secondary temperature correction in the present embodiment. As illustrated in FIG. 6A, the VT1 changes with a negative slope with respect to a change in the range of the ambient temperature of −30° C. to 85° C. As illustrated in FIG. 6B, the VT2 changes with a positive slope with respect to a change in the range of the ambient temperature of −30° C. to 85° C. Here, for example, the slope is adjusted in such a manner that when the ambient temperature is −30° C., VT2=VL, and when the ambient temperature is 85° C., VT2=VH. Then, as illustrated in FIG. 6C, when the ambient temperature is −30° C., IL=IoL/2, and near the ambient temperature of −30° C., when the ambient temperature decreases, the IL non-linearly increases. When the ambient temperature is 25° C. or 85° C., IL≅0. In addition, as illustrated in FIG. 6D, when the ambient temperature is 85° C., IH=IoH/2, and near the ambient temperature of 85° C., when the ambient temperature increases, the IH non-linearly increases. When the ambient temperature is 25° C. or −30° C., IH≅0. Thus, the secondary correction voltage is determined by the IL in a low temperature side, and is determined by the IH in a high temperature side.

Figure 7A:
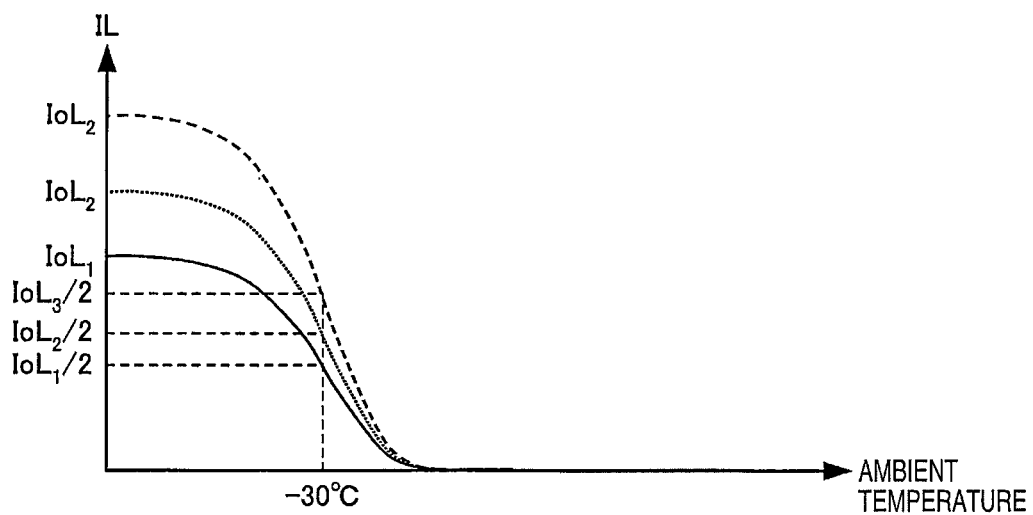
FIGS. 7A and 7B are explanatory diagrams with regard to the second temperature correction according to the present embodiment.
Figure 7B:
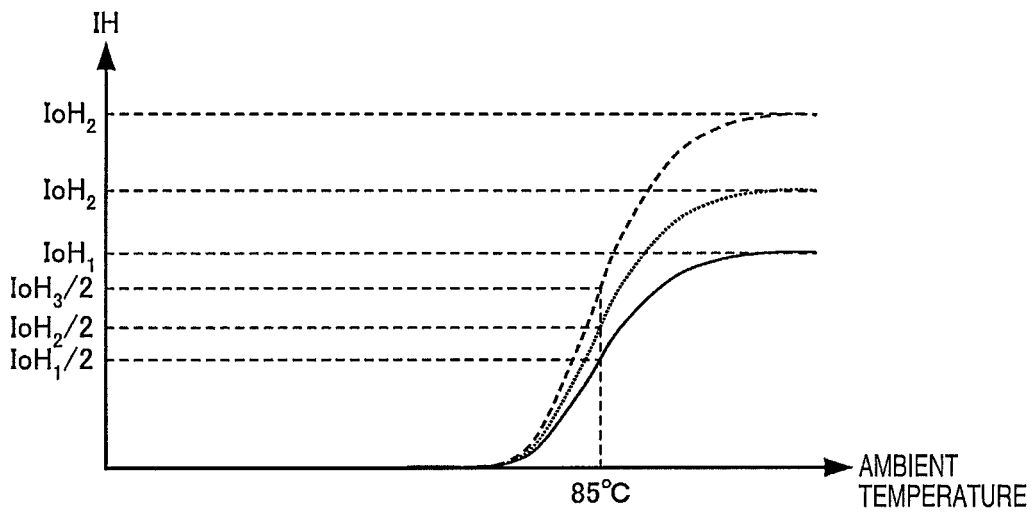

Then, as illustrated in FIG. 7A, by varying the current IoL flowing through the constant current source 127, the slope of the IL with respect to the change of the ambient temperature can be varied. Specifically, the slope of the IL becomes steep, as the IoL increases. Similarly, as illustrated in FIG. 7B, by varying the current IoH flowing through the constant current source 123, the slope of the IH with respect to the change of the ambient temperature can be varied. Specifically, the slope of the IH becomes steep, as the IoH increases. Thus, the frequency-temperature characteristics of the output signal of the oscillation circuit 30 are measured, and the IoL or IoH is adjusted in such a manner that a frequency decrease in the low temperature side or in the high temperature side is corrected, and thereby the secondary component of the frequency deviation can be efficiently reduced.

Figure 8A:
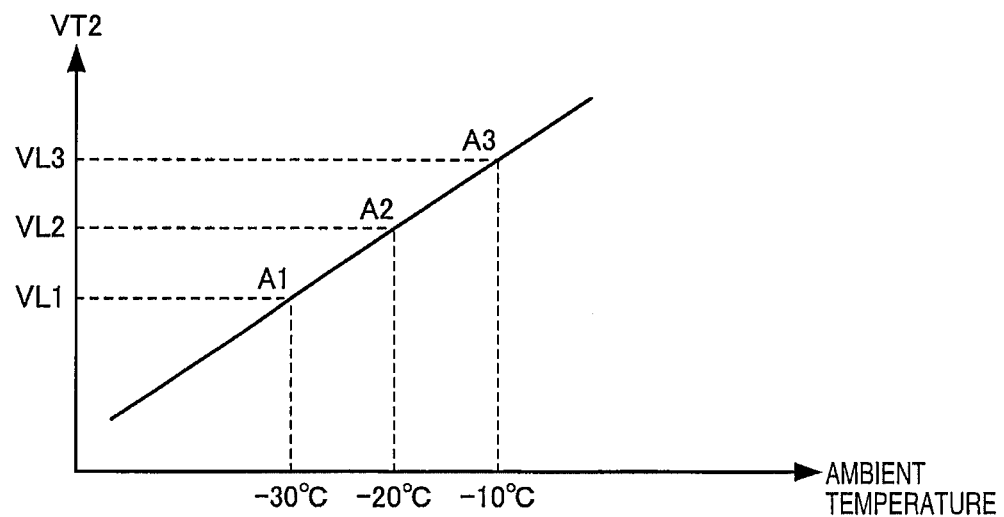
FIGS. 8A and 8B are explanatory diagrams with regard to the second temperature correction according to the present embodiment.
Figure 8B:
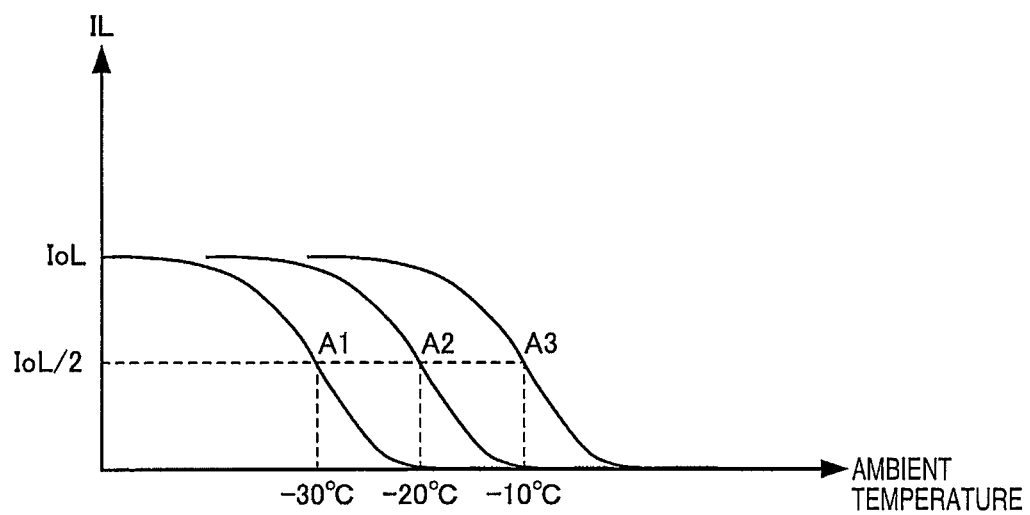
Figure 9A:
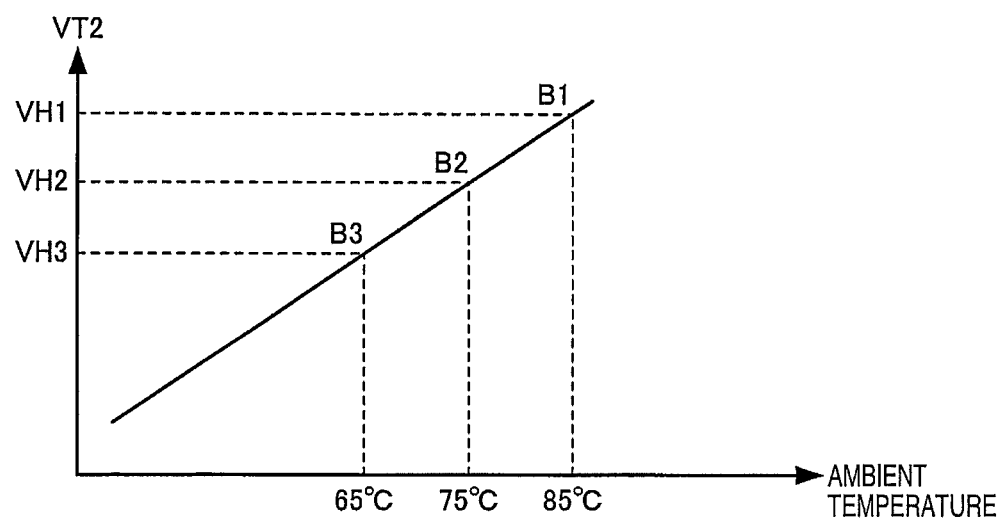
FIGS. 9A and 9B are explanatory diagrams with regard to the second temperature correction according to the present embodiment.
Figure 9B:
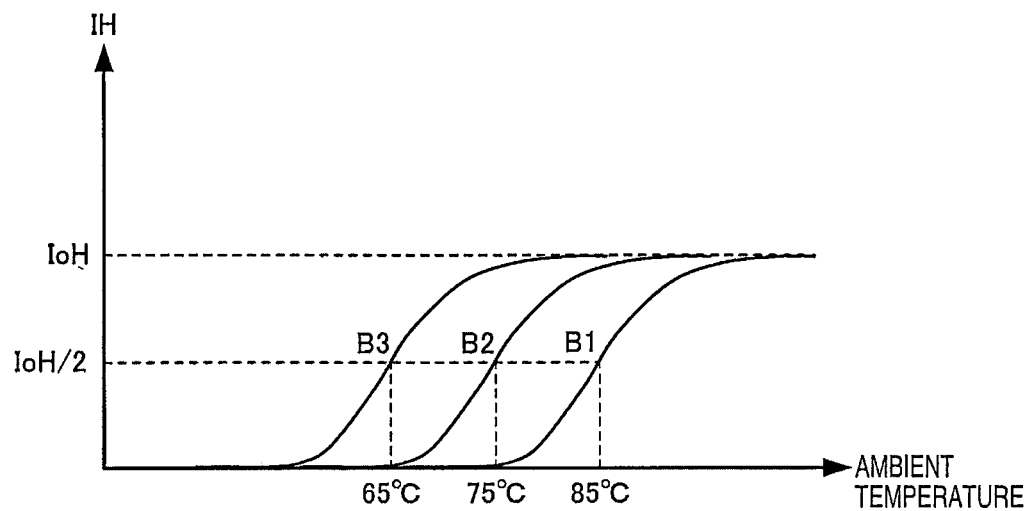

Since the operation guarantee temperature range of the oscillator 1 changes according to the usage, the secondary temperature correction in accordance with the operation guarantee temperature range is required. Accordingly, in the present embodiment, by changing the reference voltage VL or VH, the ambient temperature at which IL=IoL/2 or the ambient temperature at which IH=IoH/2 is changed. For example, as illustrated in FIG. 8A, in a case where when the ambient temperatures are −30° C., −20° C., and −10° C., the VT2s are respectively VL1, VL2, and VL3, as illustrated in FIG. 8B, by the VLs being respectively set as VL1, VL2, and VL3, IL=IoL/2 when each ambient temperature is −30° C., −20° C., and −10° C. Similarly, for example, as illustrated in FIG. 9A, in a case where when the ambient temperatures are 85° C., 75° C., and 65° C., the VT2s are respectively VH1, VH2, and VH3, as illustrated in FIG. 9B, by the VHs being respectively set as VH1, VH2, and VH3, IH=IoH/2 when each ambient temperature is 85° C., 75° C., and 65° C. Thus, the reference voltage VL or VH is adjusted in accordance with the operation guarantee temperature range, and thereby the secondary component of the frequency deviation can be efficiently reduced.

Such a correction parameter (information of IoL, IoH, VL, and VH) of the secondary correction circuit 12 is stored in the memory 80.

In the oscillator 1 of the present embodiment, the temperature correction circuit 10 includes the primary correction circuit 11 and the secondary correction circuit 12, and since the primary temperature correction and the secondary temperature correction can be independently controlled, it is possible to flexibly correspond to the correction of various frequency-temperature characteristics of the output signal of the oscillation circuit 30.

Figure 10A:
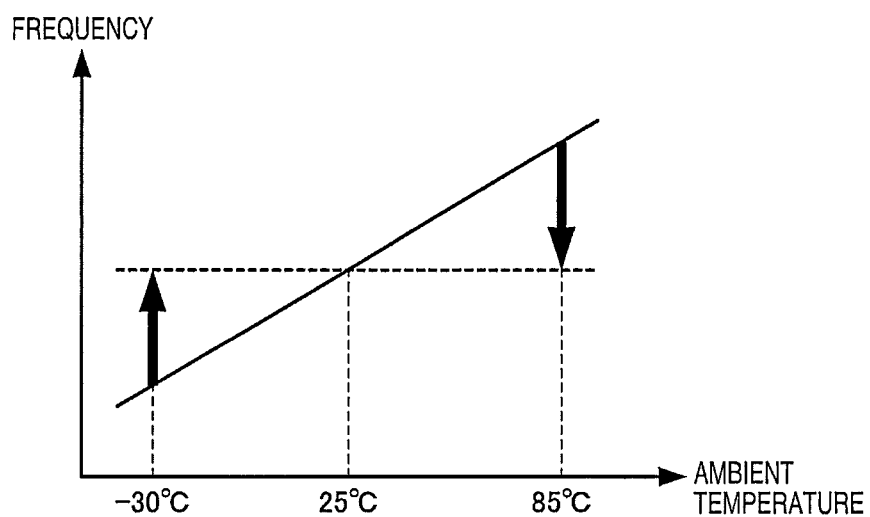
FIGS. 10A and 10B are explanatory diagrams with regard to an example of a temperature correction according to the present embodiment.
Figure 10B:
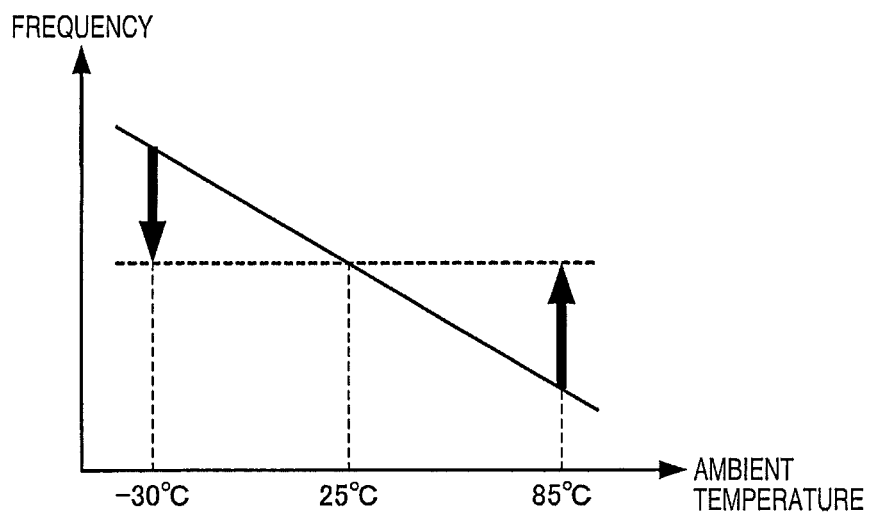

For example, in a case where only the primary component of the frequency-temperature characteristics may be corrected, the switch 119 is turned on, and the switches 124 and 128 are turned off together. As illustrated in FIG. 10A, in a case where the frequency-temperature characteristics have the positive slope with respect to the ambient temperature, the switch 118 is set in such a manner that the output terminal of the operational amplifier 114 is connected to the first terminal of the switch 119. As illustrated in FIG. 10B, in a case where the frequency-temperature characteristics have negative slope with respect to the ambient temperature, the switch 118 is set in such a manner that the output terminal of the operational amplifier 117 is connected to the first terminal of the switch 119. Then, in each case, the resistance value of the variable resistor 113 is adjusted in accordance with the slope of the frequency-temperature characteristics, and thereby it is possible to accurately reduce the frequency deviation.

Figure 11A:
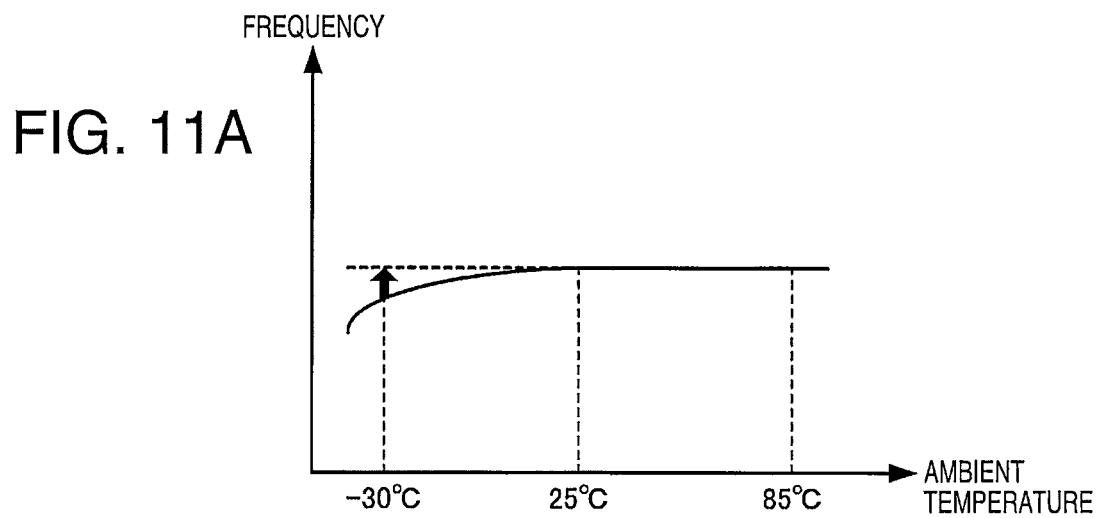
FIGS. 11A to 11C are explanatory diagrams with regard to the example of the temperature correction according to the present embodiment.
Figure 11B:
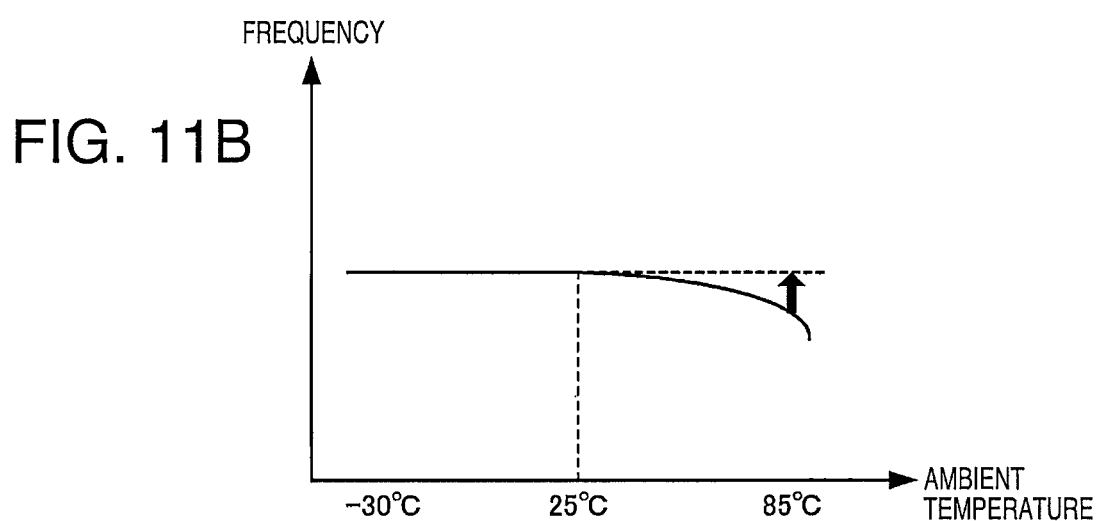
Figure 11C:
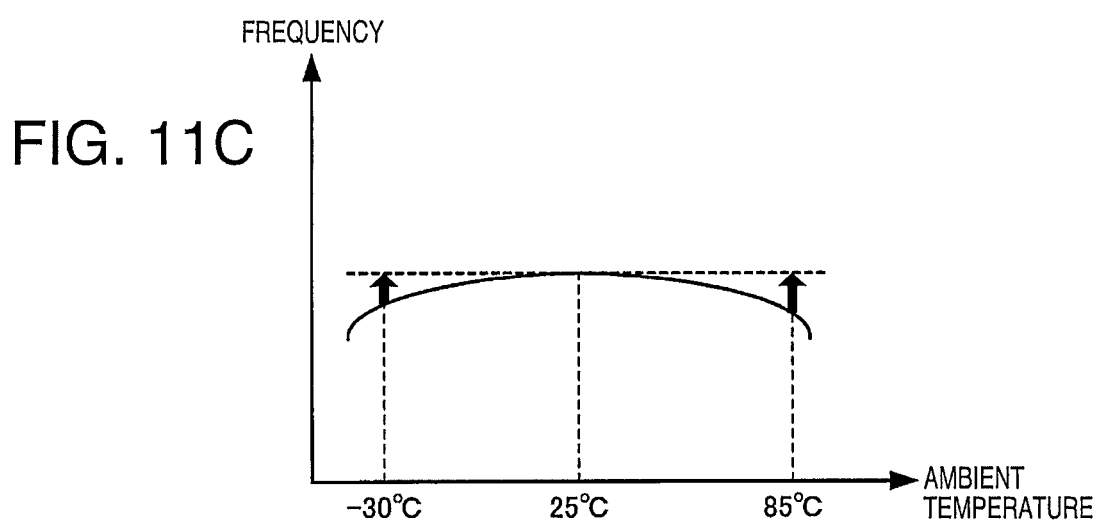

In addition, for example, in a case where only the secondary component of the frequency-temperature characteristics may be corrected, the switch 119 is turned off, and one or both of the switches 124 and 128 are turned on together. As illustrated in FIG. 11A, in a case where the frequency of the low temperature side only decreases, the switch 124 is turned off and the switch 128 is turned on, the IoL is adjusted in accordance with the frequency decrease of the low temperature side, and thereby, it is possible to accurately reduce the frequency deviation of the low temperature side. As illustrated in FIG. 11B, in a case where the frequency of the high temperature side only decreases, the switch 124 is turned on and the switch 128 is turned off, the IoH is adjusted in accordance with the frequency decrease of the high temperature side, and thereby, it is possible to accurately reduce the frequency deviation of the high frequency side. As illustrated in FIG. 11C, in a case where the frequencies of both the low temperature side and the high temperature side decrease, both the switches 124 and 128 are turned on, the IoL is adjusted in accordance with the frequency decrease of the low temperature side and the IoH is adjusted in accordance with the frequency decrease of the high temperature side, and thereby, it is possible to accurately reduce the frequency deviations of both the low temperature side and the high temperature side.

Figure 12A:
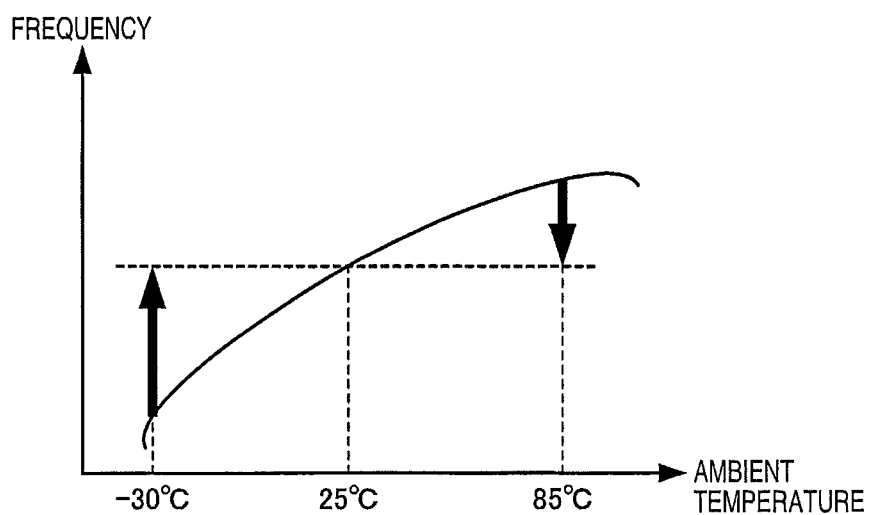
FIGS. 12A and 12B are explanatory diagrams with regard to the example of the temperature correction according to the present embodiment.
Figure 12B:
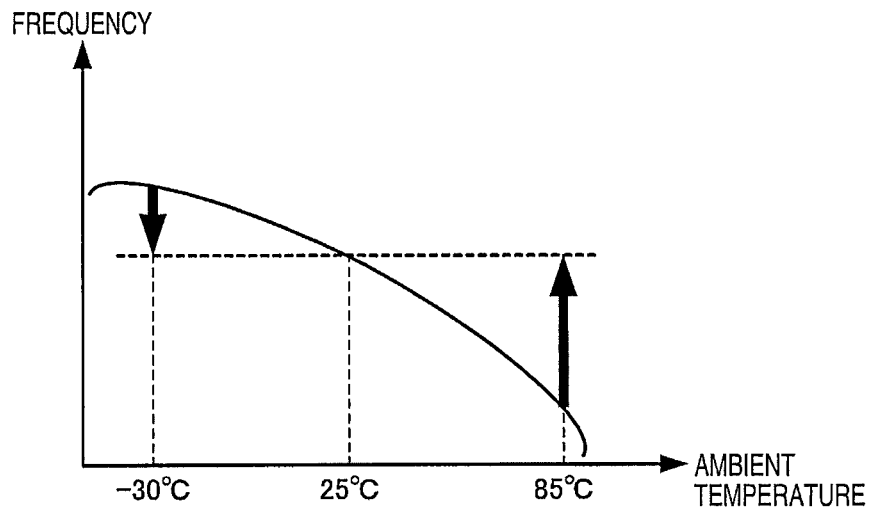

In addition, for example, in a case where both the primary component and the secondary component of the frequency-temperature characteristics may be corrected, the switch 119 is turned on, and one or both of the switches 124 and 128 are turned on. As illustrated in FIG. 12A, in a case where the frequency-temperature characteristics have the positive slope with respect to the ambient temperature and the frequencies of both the low temperature side and the high temperature side decrease, the switch 118 is set in such a manner that the output terminal of the operational amplifier 114 is connected to the first terminal of the switch 119, and the switches 124 and 128 are turned on together. As illustrated in FIG. 12B, in a case where the frequency-temperature characteristics have the negative slope with respect to the ambient temperature and the frequencies of both the low temperature side and the high temperature side decrease, the switch 118 is set in such a manner that the output terminal of the operational amplifier 117 is connected to the first terminal of the switch 119, and the switches 124 and 128 are turned on together. Then, in each case, the resistance value of the variable resistor 113 is adjusted in accordance with the slope of the frequency-temperature characteristics, the IoL is adjusted in accordance with the frequency decrease of the low temperature side, and the IoH is adjusted in accordance with the frequency decrease of the high temperature side, and thereby it is possible to accurately reduce the frequency deviation.

As described above, by independently controlling the switches 119, 124, and 128, it is possible to independently set whether to make the correction performed by the primary correction circuit 11 and the correction performed by the secondary correction circuit 12 effective or not, and thereby, it is possible to flexibly correspond to the correction of various frequency-temperature characteristics of the output signal of the oscillation circuit 30.

As described above, according to the oscillator of the present embodiment, in the same manner as the OCXO of the related art, the internal temperature of the constant temperature oven is controlled so as to be constantly maintained by the temperature control circuit 60, and further, even when the internal temperature of the constant temperature oven is slightly changed by an ambient temperature change, it is possible to accurately correct the frequency of the output signal of the oscillation circuit 30 using the temperature correction circuit 10 which includes the primary correction circuit 11 and the secondary correction circuit 12. Thus, it is possible to realize greater frequency stability than the oven controlled crystal oscillator (OCXO) of the related art.

In addition, according to the oscillator of the present embodiment, it is possible to independently set whether to make the correction performed by the primary correction circuit 11 and the correction performed by the secondary correction circuit 12 effective or not, and thereby, it is also possible to correct only the primary component, to correct only the secondary component, and to correct both the primary component and the secondary component, in accordance with the frequency-temperature characteristics of the output signal of the oscillation circuit 30.

According to the oscillator of the present embodiment, it is possible to independently set each of the correction parameter of the primary correction circuit 11 and the correction parameter of the secondary correction circuit 12, and thereby, it is possible to flexibly and efficiently correct the frequency-temperature characteristics of the output signal of the oscillation circuit 30.

In addition, according to the oscillator of the present embodiment, the reference signals VL and VH of the two differential amplification circuits included in the secondary correction circuit 12 are each adjusted, and thereby, it is possible to independently select each of two temperature areas which are targets of the secondary temperature correction. In addition, the currents IoL and IoH of the constant current sources 123 and 127 are each adjusted, and thereby it is possible to independently control the slopes of inflection points of the IL and the IH. Thus, it is possible to accurately correct the secondary component of the frequency-temperature characteristics of the output signal of the oscillation circuit 30.

2. Electronic Device

Figure 13:
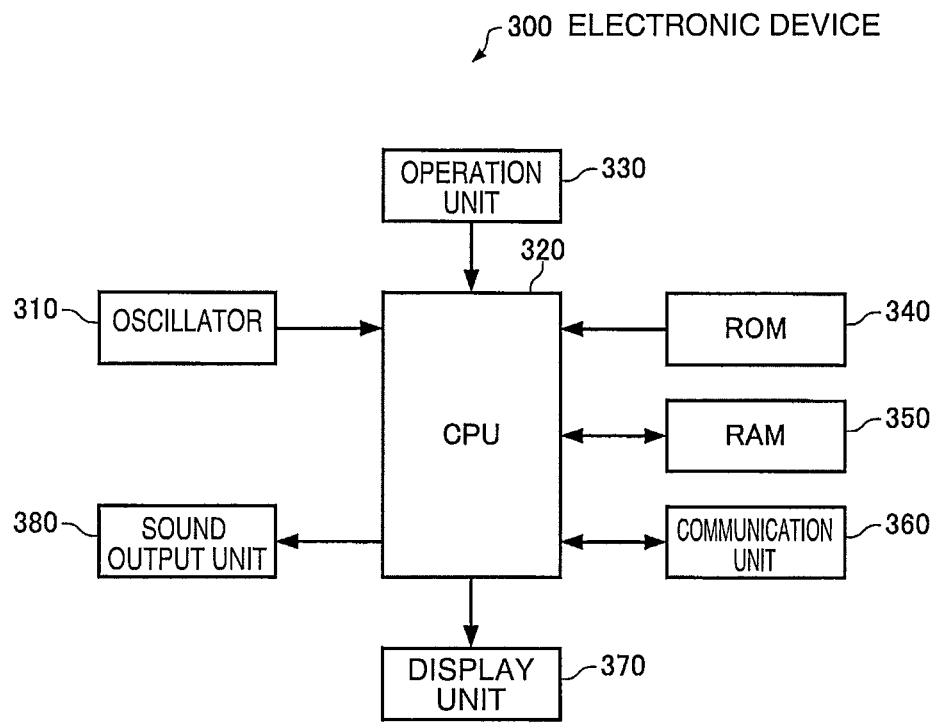
FIG. 13 is a functional block diagram of an electronic device according to the present embodiment.
Figure 14:
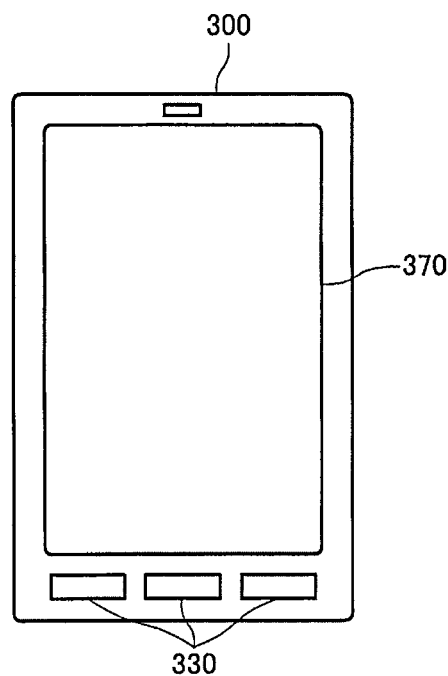
FIG. 14 is a view illustrating an example of an external shape of the electronic device according to the present embodiment.

FIG. 13 is a functional block diagram of an electronic device according to the present embodiment. FIG. 14 is a view illustrating an example of an external shape of a smartphone which is an example of an electronic device according to the present embodiment.

The electronic device 300 according to the present embodiment is configured to include an oscillator 310, a Central Processing Unit (CPU) 320, an operation unit 330, a Read Only Memory (ROM) 340, a Random Access Memory (RAM) 350, a communication unit 360, a display unit 370, and a sound output unit 380. Meanwhile, in the electronic device according to the present embodiment, a portion of the configuration elements (each unit) illustrated in FIG. 13 may be omitted or modified, or other configuration elements may be added thereto.

The oscillator 310 is an oscillator which generates a clock signal with a small frequency deviation in the operation guarantee temperature range. As the oscillator 310, the oscillator 1 according to the present embodiment described above can be employed.

The CPU 320 performs various calculation processes or control processes using the clock signal generated by the oscillator 310, according to a program stored in the ROM 340 or the like. In addition to this, the CPU 320 performs various processes according to an operation signal from the operation unit 330, a process of controlling the communication unit 360 in order to perform a data communication with an external device, a process of transmitting a display signal for displaying various information on the display unit 370, and a process of outputting various sounds to the sound output unit 380.

The operation unit 330 is an input device which is configured by an operation key, a button switch or the like, and outputs an operation signal to the CPU 320 according to an operation performed by a user.

The ROM 340 stores the program, data or the like for performing various calculation processes or the control process performed by the CPU 320.

The RAM 350 is used as an operation area of the CPU 320, and temporarily stores the program or the data read from the ROM 340, data input from the operation unit 330, a calculation result which is obtained by executing various programs performed by the CPU 320.

The communication unit 360 performs various controls for a data communication between the CPU 320 and the external device.

The display unit 370 is a display device which is configured by a Liquid Crystal Display (LCD), an organic EL display, or the like, and displays various information based on the display signal input from the CPU 320. A touch panel which functions as the operation unit 330 may be provided to the display unit 370.

The sound output unit 380 is a device, which outputs a sound, such as a speaker.

It is possible to realize an electronic device with a higher reliability by incorporating the oscillator 1 according to the present embodiment described above as the oscillator 310.

As the electronic device 300, various electronic devices, such as a personal computer (for example, a mobile type personal computer, a laptop type personal computer, a notebook type personal computer, tablet type personal computer), a mobile terminal such as a cellular phone, a digital still camera, an ink jet type ejection device (for example, an ink jet printer), a storage area network device such as a router or a switch, a local area network device, a television, a video camera, a video recorder, a car navigation device, a pager, an electronic notebook (including communication function also), an electronic dictionary, an electronic calculator, an electronic game device, a game controller, a word processor, a workstation, a videophone, a security television monitor, an electronic binocular, a POS terminal, a medical device (for example, an electronic thermometer, a blood pressure meter, a blood glucose meter, an electrocardiogram measuring device, an ultrasonic diagnosis device, an electronic endoscope), a fish finder, various measuring device, instruments (for example, an instrument of a vehicle, an aircraft, or a ship), a flight simulator, a head-mounted display, a motion trace, motion tracking, a motion controller, or a PDR (pedestrian position orientation measurement), can be used.

3. Moving Object

Figure 15:
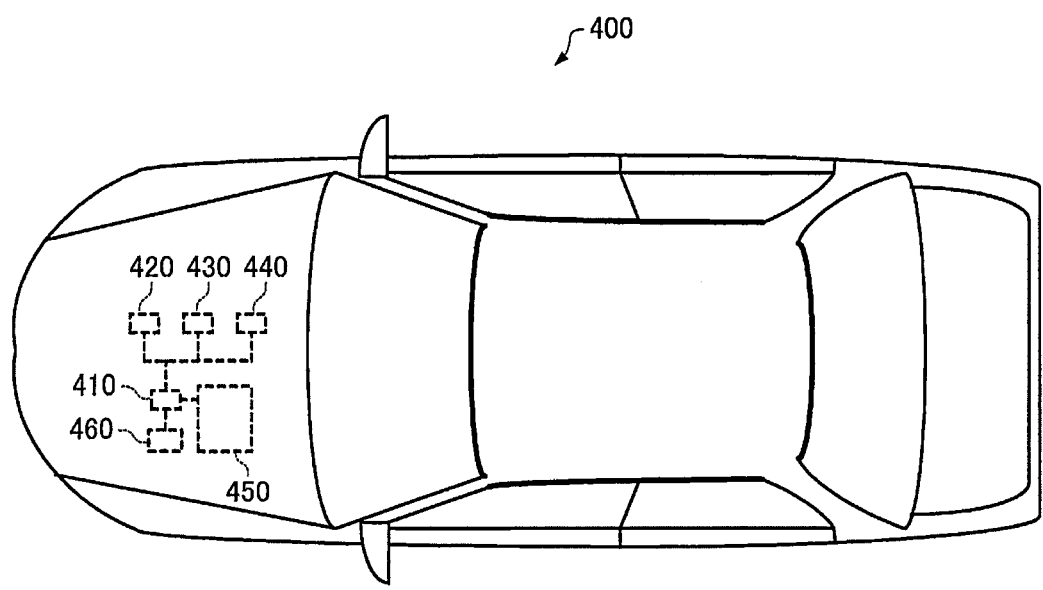
FIG. 15 is a view illustrating an example of a moving object according to the present embodiment.
Figure 16A:
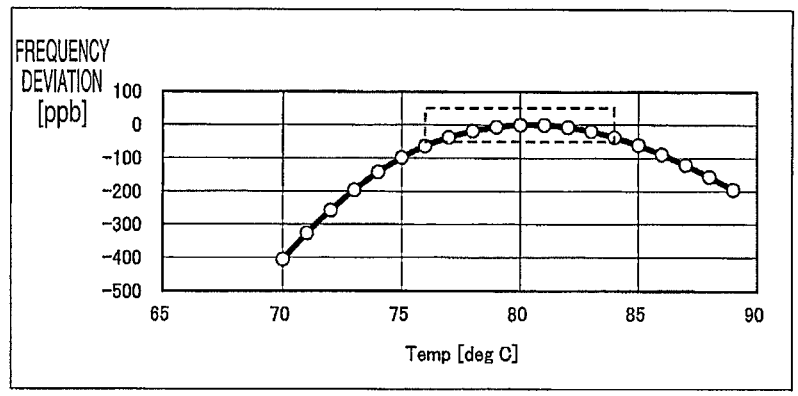
FIGS. 16A to 16C are explanatory diagrams with regard to frequency-temperature characteristics of OCXO of the related art.
Figure 16B:
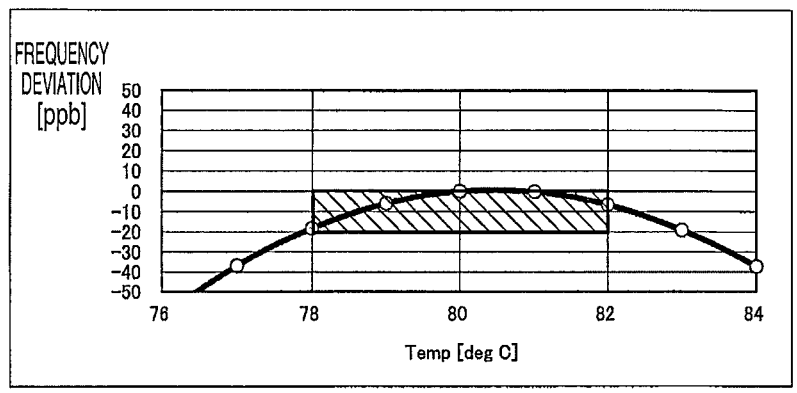
Figure 16C:
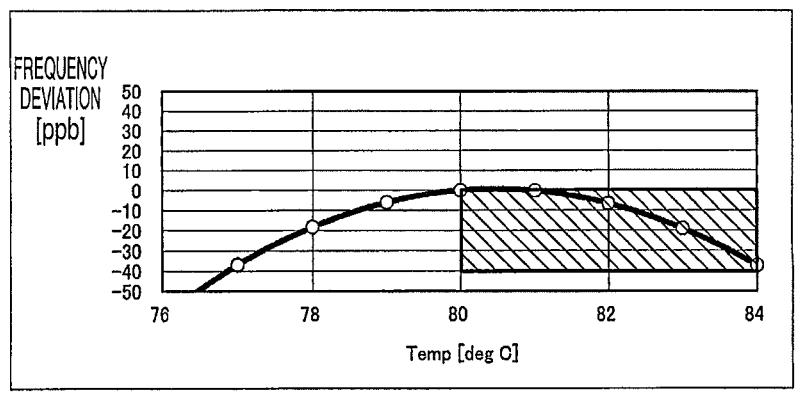

FIG. 15 is a view (top view) illustrating an example of a moving object according to the present embodiment. The moving object 400 illustrated in FIG. 15 is configured to include an oscillator 410, controllers 420, 430, and 440, a battery 450, and a backup battery 460. Meanwhile, in the moving object according to the present embodiment, a portion of the configuration elements (each unit) illustrated in FIG. 15 may be omitted or modified, or other configuration elements may be added thereto.

The oscillator 410, and the controllers 420, 430, and 440 operate using a supply voltage supplied from the battery 450, or operate using a supply voltage supplied from the backup battery 460, when the supply voltage of the battery 450 decreases.

The oscillator 410 is an oscillator which generates a clock signal with a small frequency deviation at the operation guarantee temperature range.

The controllers 420, 430, and 440 performs various controls such as an engine system, a brake system, a keyless entry system, a posture control system, and rollover protection system by using the clock signal generated by the oscillator 410.

For example, as the oscillator 410, the oscillator 1 according to the present embodiment described above can be employed, and thereby it is possible to secure a high reliability.

As the moving object 400, various moving objects, such as a car (including an electric car also), an aircraft such as a jet plane or helicopter, a ship, a rocket, or an artificial satellite, can be used.

Meanwhile, the invention is not limited to the present embodiments, and various modifications can be made within a range of the gist of the invention.

For example, in FIG. 5, the secondary correction circuit 12 of the temperature correction circuit 10 includes two differential amplification circuits, and is configured to be able to correct the secondary component of the frequency-temperature characteristics at two different temperature areas, but the secondary correction circuit 12 may include three or more differential amplification circuits, or is configured to be able to correct the secondary component of the frequency-temperature characteristics at three or more different temperature areas. By doing this, it is possible to perform a flexible and efficient temperature correction.

In addition, for example, in the present embodiment, the temperature correction circuit 10 includes the primary correction circuit 11 and the secondary correction circuit 12, but may not include the primary correction circuit 11 or the secondary correction circuit 12, according to the frequency-temperature characteristics of the oscillation element 20, a required performance, or the like.

The invention includes substantially the same configuration (for example, configuration with the same function, method and result, or configuration with the same object and effect) as the configuration described in the embodiment. In addition, the invention includes a configuration which replaces non-essential parts of the configuration described in the embodiment. In addition, the invention includes a configuration which obtains the same function effect as the configuration described in the embodiment, or a configuration which can achieve the same object. In addition, the invention includes a configuration in which a known technology is added to the configuration described in the embodiment.

The entire disclosure of Japanese Patent Application No. 2013-71823, filed Mar. 29, 2013 is expressly incorporated by reference herein.

What is claimed is:

1. An oscillator comprising:
an oscillation element;
an oscillation circuit which causes the oscillation element to oscillate;
a heat generation element which heats the oscillation element;
a temperature control circuit which controls the heat generation element; and
a temperature correction circuit which generates a temperature correction voltage for correcting frequency-temperature characteristics of an output signal of the oscillation circuit,
the temperature correction circuit comprising:
a primary correction circuit which corrects a primary component of the frequency-temperature characteristics of the output signal of the oscillation circuit, the primary correction circuit generating a primary correction voltage, and
a secondary correction circuit which corrects a secondary component of the frequency-temperature characteristics of the output signal of the oscillation circuit, the secondary correction circuit generating a secondary correction voltage that changes non-linearly with respect to a change of temperature.

2. The oscillator according to claim 1,
wherein the temperature correction circuit independently controls an operation of the primary correction circuit and an operation of the secondary correction circuit.

3. The oscillator according to claim 1,
wherein whether to make each of the correction performed by the first correction circuit and the correction performed by the second correction circuit effective or not is independently set.

4. The oscillator according to claim 1,
wherein correction parameters of the secondary correction circuit are independently set in a plurality of temperature areas, respectively.

5. The oscillator according to claim 1,
wherein the secondary correction circuit includes a differential amplification circuit that has a first transistor to which an output voltage of a temperature sensor is input, a second transistor to which a reference voltage is input, and a constant current source which controls a sum of a current flowing through the first transistor and a current flowing through the second transistor constantly.

6. A moving object comprising:
the oscillator according to claim 1.

7. The oscillator according to claim 2,
wherein whether to make each of the correction performed by the first correction circuit and the correction performed by the second correction circuit effective or not is independently set.

8. The oscillator according to claim 2,
wherein correction parameters of the secondary correction circuit are independently set in a plurality of temperature areas, respectively.

9. The oscillator according to claim 2,
wherein the secondary correction circuit includes a differential amplification circuit that has a first transistor to which an output voltage of a temperature sensor is input, a second transistor to which a reference voltage is input, and a constant current source which controls a sum of a current flowing through the first transistor and a current flowing through the second transistor constantly.

10. The oscillator according to claim 7,
wherein correction parameters of the secondary correction circuit are independently set in a plurality of temperature areas, respectively.

11. The oscillator according to claim 3,
wherein correction parameters of the secondary correction circuit are independently set in a plurality of temperature areas, respectively.

12. The oscillator according to claim 9,
wherein the differential amplification circuit is set in such a manner that the reference voltage input to the second transistor is variable.

13. The oscillator according to claim 9,
wherein the differential amplification circuit is set in such a manner that a current of the constant current source is variable.

14. The oscillator according to claim 9,
wherein the secondary correction circuit includes a plurality of differential amplification circuits, and
wherein the plurality of differential amplification circuits respectively have the reference voltages which are different from each other and input to the second transistor.

15. An electronic device comprising:

the oscillator according to claim 1.

* * * * *